(12) United States Patent
Owaki et al.

(10) Patent No.: US 10,090,843 B2
(45) Date of Patent: Oct. 2, 2018

(54) OSCILLATOR INCLUDING FIRST AND SECOND CONTAINERS FOR HOUSING RESONATOR AND SEMICONDUCTOR DEVICE

(71) Applicant: Seiko Epson Corporation, Tokyo (JP)

(72) Inventors: Takuya Owaki, Minowa (JP); Hideyuki Kanno, Minowa (JP)

(73) Assignee: Seiko Epson Corporation (JP)

( * ) Notice: Subject to any disclaimer, the term of this patent is extended or adjusted under 35 U.S.C. 154(b) by 183 days.

(21) Appl. No.: 15/075,563

(22) Filed: Mar. 21, 2016

(65) Prior Publication Data
US 2016/0285463 A1 Sep. 29, 2016

(30) Foreign Application Priority Data
Mar. 27, 2015 (JP) ................. 2015-067359

(51) Int. Cl.
H03B 5/32 (2006.01)
H03L 1/04 (2006.01)
H03B 5/36 (2006.01)
H03L 1/02 (2006.01)

(52) U.S. Cl.
CPC ............. *H03L 1/04* (2013.01); *H03B 5/36* (2013.01); *H03L 1/022* (2013.01); *H03L 1/026* (2013.01)

(58) Field of Classification Search
CPC ............ H03L 1/022; H03L 1/026; H03B 5/36

USPC ............................ 331/176, 68, 158, 117 FE
See application file for complete search history.

(56) References Cited

U.S. PATENT DOCUMENTS

2009/0212878 A1* 8/2009 Arai .................... H03B 5/04
                                                                  331/158
2014/0152392 A1    6/2014 Owaki et al.

FOREIGN PATENT DOCUMENTS

| JP | 2004-336374 A | 11/2004 |
| JP | 2008-136004 A | 6/2008 |
| JP | 2010-103802 A | 5/2010 |
| JP | 2010-213102 A | 9/2010 |
| JP | 2014-107862 A | 6/2014 |

\* cited by examiner

*Primary Examiner* — Arnold Kinkead
(74) *Attorney, Agent, or Firm* — Harness, Dickey & Pierce, P.L.C.

(57) ABSTRACT

An oscillator includes a resonator element; and a semiconductor device including an oscillation circuit which outputs an oscillation signal by oscillating the resonator element, a temperature compensation circuit which compensates for temperature characteristics of a frequency of the oscillation signal, and a first surface in which a terminal that is electrically connected to the resonator element is disposed. The semiconductor device overlaps the resonator element in a planar view. Frequency deviation of the oscillation signal, which is compensated for by the temperature compensation circuit, is greater than or equal to −150 ppb and smaller than or equal to +150 ppb in a temperature range from −5° C. to +85° C.

22 Claims, 9 Drawing Sheets

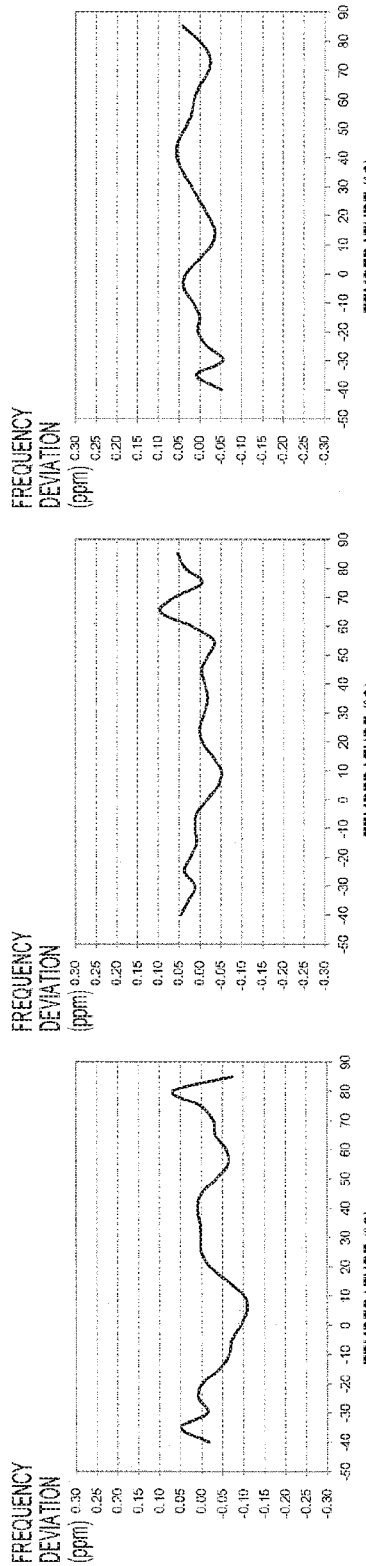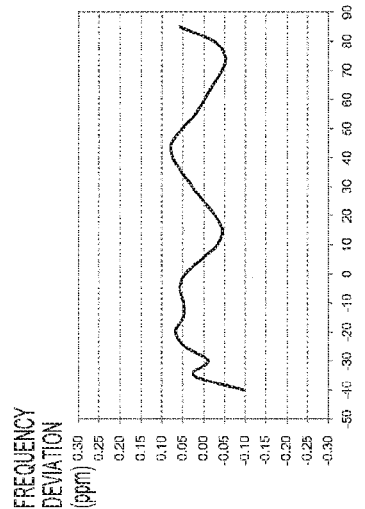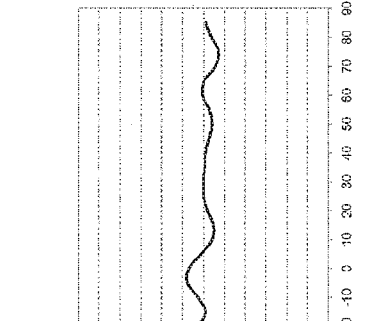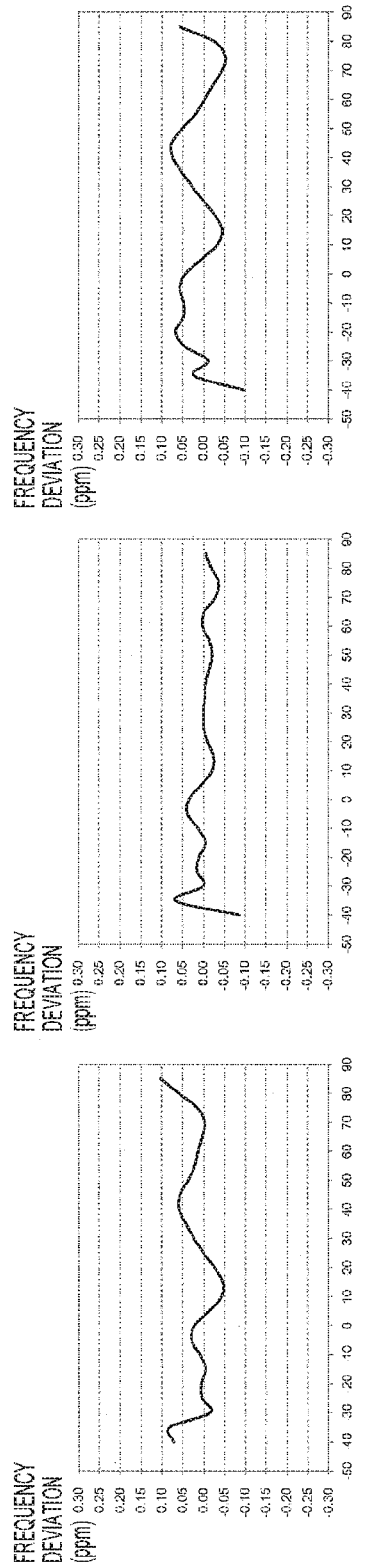

OSCILLATOR INCLUDING FIRST AND SECOND CONTAINERS FOR HOUSING RESONATOR AND SEMICONDUCTOR DEVICE

BACKGROUND

1. Technical Field

The invention relates to an oscillator, an electronic apparatus, and a moving object.

2. Related Art

A temperature compensated crystal oscillator (TCXO) includes a crystal resonator and an integrated circuit (IC) for oscillating the crystal resonator, and can obtain high frequency accuracy, as the IC compensates (temperature-compensates) for deviation (frequency deviation) from a desired frequency (nominal frequency) of an oscillation frequency of a crystal resonator in a predetermined temperature range. The TCXO is disclosed in, for example, JP-A-2014-107862 or JP-A-2010-103802.

However, at present, a TCXO with frequency temperature characteristics which come close to those of an oven-controlled crystal oscillator (OCXO) in which a heater is mounted does not exist, and thus, the majority of oscillators which are used for a communication apparatus requiring high frequency accuracy, or a base station is the OCXO, and this causes high manufacturing costs.

SUMMARY

An advantage of some aspects of the invention is to provide a temperature compensated oscillator which can also be used for an electronic apparatus that requires high frequency accuracy, and in addition, to provide an electronic apparatus and a moving object which use the oscillator.

The invention can be implemented as the following forms or application examples.

Application Example 1

An oscillator according to this application example includes a resonator element; and a semiconductor device including an oscillation circuit which outputs an oscillation signal by oscillating the resonator element, a temperature compensation circuit which compensates for temperature characteristics of a frequency of the oscillation signal, and a first surface on which a terminal that is electrically connected to the resonator element is disposed, in which the semiconductor device overlaps the resonator element in a planar view, and in which frequency deviation of the oscillation signal which is compensated for by the temperature compensation circuit is greater than or equal to −150 ppb and smaller than or equal to +150 ppb in a temperature range from −5° C. to +85° C.

Various oscillation circuits such as, a Pierce oscillation circuit, an inverter type oscillation circuit, a Colpitts oscillation circuit, or a Hartley oscillation circuit may be configured by a resonator element and an oscillation circuit.

In the oscillator according to this application example, the resonator element and the semiconductor device are disposed at places which are spatially close to each other, and thus, the heat of the semiconductor device is conducted to the resonator element in a short time, and it is possible to reduce a temperature difference between the semiconductor device and the resonator element, compared to that in the related art. As a result, according to the oscillator of the application example, it is possible to realize an unprecedented temperature compensated oscillator that exhibits the frequency temperature characteristics of an OCXO in which frequency deviation, which is greater than or equal to −150 ppb and smaller than or equal to +150 ppb, of the oscillation signal compensated for by the temperature compensation circuit, in a temperature range from −5° C. to +85° C. Hence, it is also possible to use the oscillator according to the application example for an electronic apparatus in which, for example, the OCXO is used and which requires high frequency accuracy.

Application Example 2

In the oscillator according to the application example, the frequency deviation may be greater than or equal to −150 ppb and smaller than or equal to +150 ppb in a temperature range from −40° C. to +85° C.

The oscillator according to this application example is an unprecedented temperature compensated oscillator that exhibits the frequency temperature characteristics of an OCXO in which frequency deviation is greater than or equal to −150 ppb and smaller than or equal to +150 ppb in a temperature range from −40° C. to +85° C., and can also be used for an electronic apparatus which requires high frequency accuracy.

Application Example 3

In the oscillator according to the application example, deviation of a resonance frequency of the resonator element with respect to an approximation equation which is higher than or equal to a third order of frequency temperature characteristics of the resonator element may be greater than or equal to −150 ppb and smaller than or equal to +150 ppb.

According to this application example, temperature compensation data for realizing an oscillator with frequency deviation of the frequency temperature characteristics which is greater than or equal to −150 ppb and smaller than or equal to +150 ppb can be easily generated, in the temperature compensation adjustment of the oscillator, even if variations of temperature characteristics of the oscillation circuit or the temperature compensation circuit are taken into account. Accordingly, it is possible to increase the yield of the oscillator.

Application Example 4

In the oscillator according to the application example, the oscillator may further include a first container which contains the resonator element, and the semiconductor device may include a surface, which is bonded to the first container through an adhesive member, on a side opposite to the first surface.

According to this oscillator of the application example, the semiconductor device is bonded to the first container containing the resonator element through the adhesive member, and thus, the heat of the semiconductor device is conducted to the resonator element in a short time, and a temperature difference between the semiconductor device and the resonator element can be reduced, compared to the related art. As a result, according to the oscillator of the application example, an error of the temperature compensation which is performed by the temperature compensation circuit decreases, and it is possible to realize characteristics in which frequency deviation is greater than or equal to −150 ppb and smaller than or equal to +150 ppb.

Application Example 5

In the oscillator according to the application example, the first container may include a base, and a first lid of a metal which covers the resonator element, together with the base, and the semiconductor device may be bonded to the first lid.

According to this oscillator of the application example, the semiconductor device is bonded to the first lid of a metal in a container which contains the resonator element, and thus, the heat of the semiconductor device is conducted to the resonator element in a short amount of time, and the temperature difference between the semiconductor device and the resonator element can be reduced, compared to the related art. In addition, since the first lid of a metal has high thermal conductivity, the heat of the semiconductor device is conducted to the resonator element through the first lid in a shorter amount of time, and a temperature difference between the semiconductor device and the resonator element can be further reduced, compared to the related art. As a result, according to the oscillator of the application example, an error of the temperature compensation which is performed by the temperature compensation circuit decreases, and it is possible to realize characteristics in which frequency deviation is greater than or equal to −150 ppb and smaller than or equal to +150 ppb.

Application Example 6

An oscillator according to this application Example includes a resonator element; a semiconductor device including an oscillation circuit which outputs an oscillation signal by oscillating the resonator element, a temperature compensation circuit which compensates for temperature characteristics of a frequency of the oscillation signal, and a first surface in which a terminal that is electrically connected to the resonator element is disposed; a first container which contains the resonator element and includes a first lid of a metal which overlaps the resonator element in a planar view; and a second container which contains the first container and the semiconductor device, in which the first container is disposed such that a surface on a side opposite to the first lid side faces an inner surface of the second container, in which the semiconductor device having a surface on a side opposite to the first surface is bonded to the first lid through an adhesive member so as to overlap the resonator element in a planar view, and in which frequency deviation of the oscillation signal which is compensated for by the temperature compensation circuit is greater than or equal to −150 ppb and smaller than or equal to +150 ppb in a temperature range from −5° C. to +85° C.

Various oscillation circuits such as, a Pierce oscillation circuit, an inverter type oscillation circuit, a Colpitts oscillation circuit, or a Hartley oscillation circuit may be configured by a resonator element and an oscillation circuit.

In the oscillator according to this application example, the lid of a container which contains the resonator element has high thermal conductivity, and thus, the heat of the semiconductor device is conducted to the resonator element through the lid in a shorter time, and a temperature difference between the semiconductor device and the resonator element can be further reduced, compared to the related art. As a result, according to the oscillator of the application example, it is possible to realize an unprecedented temperature compensated oscillator that exhibits the frequency temperature characteristics of an OCXO in which frequency deviation, which is greater than or equal to −150 ppb and smaller than or equal to +150 ppb, of the oscillation signal compensated for by the temperature compensation circuit, in a temperature range from −5° C. to +85° C. Hence, it is also possible to use the oscillator according to the application example for an electronic apparatus in which, for example, the OCXO is used and which requires high frequency accuracy.

Application Example 7

In the oscillator according to the application example, the frequency deviation may be greater than or equal to −150 ppb and smaller than or equal to +150 ppb in a temperature range from −40° C. to +85° C.

According to this application example, the oscillator is an unprecedented temperature compensated oscillator that exhibits the frequency temperature characteristics of an OCXO in which frequency deviation is greater than or equal to −150 ppb and smaller than or equal to +150 ppb in a temperature range from −40° C. to +85° C., and can also be used for an electronic apparatus which requires high frequency accuracy.

Application Example 8

In the oscillator according to the application example, deviation of a resonance frequency of the resonator element with respect to an approximation equation which is higher than or equal to a third order of frequency temperature characteristics of the resonator element may be greater than or equal to −150 ppb and smaller than or equal to +150 ppb.

According to this oscillator of the application example, temperature compensation data for realizing an oscillator with frequency deviation of the frequency temperature characteristics which is greater than or equal to −150 ppb and smaller than or equal to +150 ppb can be easily generated, in the temperature compensation adjustment of the oscillator, even if variations of temperature characteristics of the oscillation circuit or the temperature compensation circuit are taken into account. Accordingly, it is possible to increase the yield of the oscillator.

Application Example 9

In the oscillator according to the application example, the second container may include a second lid which overlaps the first container and the semiconductor device in a planar view, the inner surface may include a surface on which wires are disposed, and a surface on which the second lid is exposed, and the first container may be disposed on a surface on which the wires are disposed.

According to this oscillator of the application example, it is possible to increase frequency stability more than that of the related art, and degree of freedom of an electrical connection between the resonator element and the semiconductor device increases.

Application Example 10

An electronic apparatus according to this application example includes any of the oscillators described above.

According to this application examples, a temperature compensated oscillator with frequency temperature characteristics which do not exist in the related art is used, and thus, it is also possible to realize an electronic apparatus with high frequency accuracy, with lower cost than the related art.

Application Example 11

A moving object according to this application example includes any of the oscillators described above.

According to this application examples, a temperature compensated oscillator with frequency temperature characteristics which do not exist in the related art is used, and thus, it is also possible to realize a moving object with high reliability.

BRIEF DESCRIPTION OF THE DRAWINGS

The invention will be described with reference to the accompanying drawings, wherein like numbers reference like elements.

FIGS. 5A to 5F are diagrams illustrating an example of frequency temperature characteristics of the oscillator according to the present embodiment.

DESCRIPTION OF EXEMPLARY EMBODIMENTS

Hereinafter, preferred embodiments of the invention will be described in detail with reference to the accompanying drawings. The embodiments which will be described hereinafter do not unduly limit the content of the invention described in the scope of the appended claims. In addition, the entire configurations which will be described hereinafter are not limited as essential configuration requirements of the invention.

1. Oscillator 1-1. First Embodiment

Configuration of Oscillator

Figure 1:
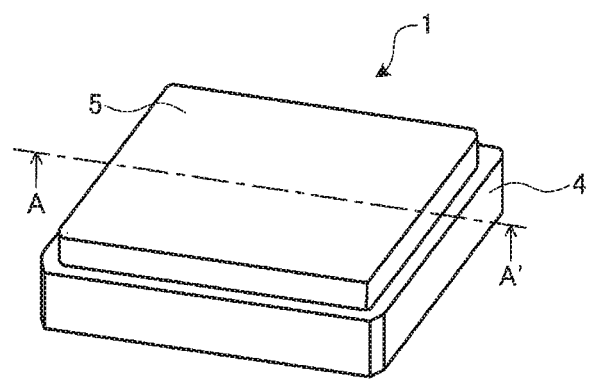
FIG. 1 is a perspective view of an oscillator according to the present embodiment.
Figure 2A:
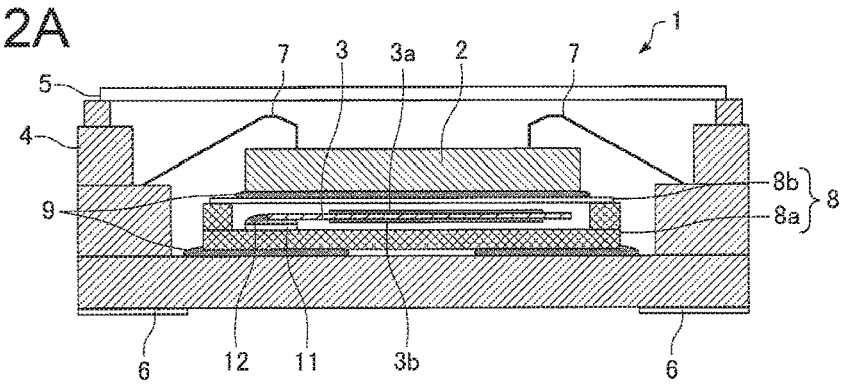
FIG. 2A is a sectional view of the oscillator according to a first embodiment.
Figure 2B:
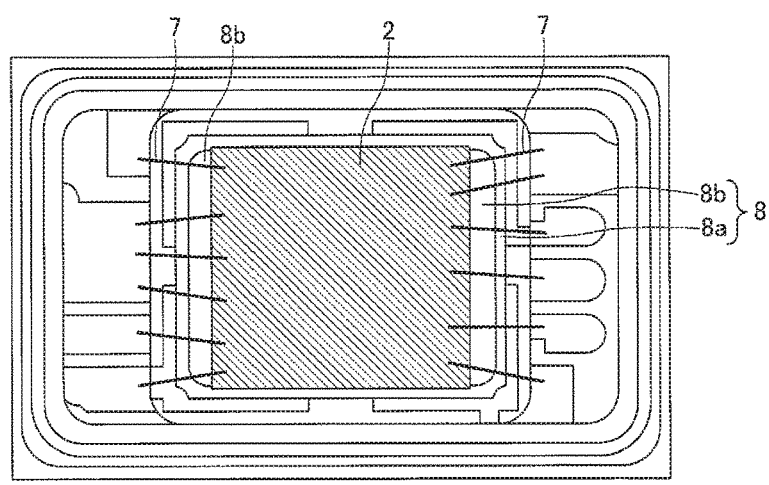
FIG. 2B is a top view of the oscillator according to the first embodiment.
Figure 2C:
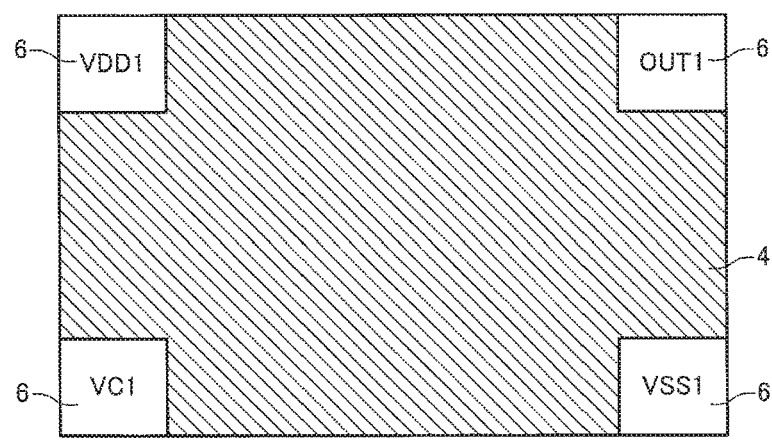
FIG. 2C is a bottom view of the oscillator.

FIG. 1 and FIGS. 2A to 2C are views illustrating an example of a configuration of an oscillator according to a first embodiment. FIG. 1 is a perspective view of the oscillator, FIG. 2A is a sectional view taken along line A-A' of FIG. 1, FIG. 2B is a top view of the oscillator, and FIG. 2C is a bottom view of the oscillator. However, FIG. 2B is illustrated in a state in which there is no lid 5 of FIG. 2A.

As illustrated in FIG. 1 and FIGS. 2A to 2C, an oscillator 1 according to the present embodiment is configured to include an integrated circuit (IC) 2 that is a semiconductor device, a resonator element (resonator reed) 3, a package 4, the lid (cover) 5, and an external terminal (external electrode) 6.

For example, a crystal resonator element, a surface acoustic wave (SAW) resonance element, other piezoelectric resonator elements or micro electromechanical systems (MEMS) resonator element, or the like can be used as the resonator element 3. A piezoelectric material such as, piezoelectric single crystal such as quartz crystal, lithium tantalate, lithium niobate, piezoelectric ceramics such as lead zirconate titanate, a silicon semiconductor material, or the like can be used as a substrate material of the resonator element 3. A material which uses piezoelectric effects, or a material which uses electrostatic drive that is performed by Coulomb force may be used as an excitation unit of the resonator element 3.

The package 4 contains the integrated circuit (IC) 2 and the resonator element 3 in the same space. Specifically, a concave section is provided in the package 4, and the package 4 contains the integrated circuit (IC) 2 and the resonator element 3 by covering the concave section using the lid 5. Wires (not illustrated) for electrically connecting two terminals (an XO terminal and an XI terminal of FIG. 3 which will be described below) of the integrated circuit (IC) 2 to two terminals (excitation electrodes 3a and 3b) of the resonator element 3, respectively, are provided in the inside of the package 4 or on a surface of the concave section. In addition, wires (not illustrated) which are electrically connected to each of the external terminals 6 are provided in the inside of the package 4 or on the surface of the concave section, and each wire is bonded to each terminal of the integrated circuit (IC) 2 by bonding wires 7 of gold or the like.

The resonator element 3 includes the excitation electrodes 3a and 3b of a metal on a front surface and a rear surface thereof, respectively, and oscillates at a desired frequency (frequency required by the oscillator 1) corresponding to mass of the resonator element 3 including the excitation electrodes 3a and 3b.

In the present embodiment, the resonator element 3 is contained in a package (container) 8 (the resonator element 3 is fixed to an electronic pad 11 which is disposed on a base 8a by a connection member 12 such as conductive adhesive). The package 8 includes the base 8a and a lid 8b (cover) which seals the base 8a, and the base 8a is bonded to the package 4 by an adhesive member 9 such as a resin. In addition, the integrated circuit (IC) 2 is bonded to the package 8 by the adhesive member 9. Particularly, in the present embodiment, the integrated circuit (IC) 2 is bonded to the lid 8b by the adhesive member 9. Then, as illustrated in FIG. 2B, the integrated circuit (IC) 2 overlaps the package 8 (resonator element 3), in a planar view in which the oscillator 1 is viewed from an upper surface.

As illustrated in FIG. 2C, an external terminal VDD1 that is a power supply terminal, an external terminal VSS1 that is a ground terminal, an external terminal VC1 that is a terminal to which a signal for frequency control is input, four external terminals 6 of an external terminal OUT1 that is an output terminal are provided on a bottom surface (a rear surface of the package 4) of the oscillator 1. A power supply voltage is supplied to the external terminal VDD1, and the external terminal VSS1 is grounded.

Figure 3:
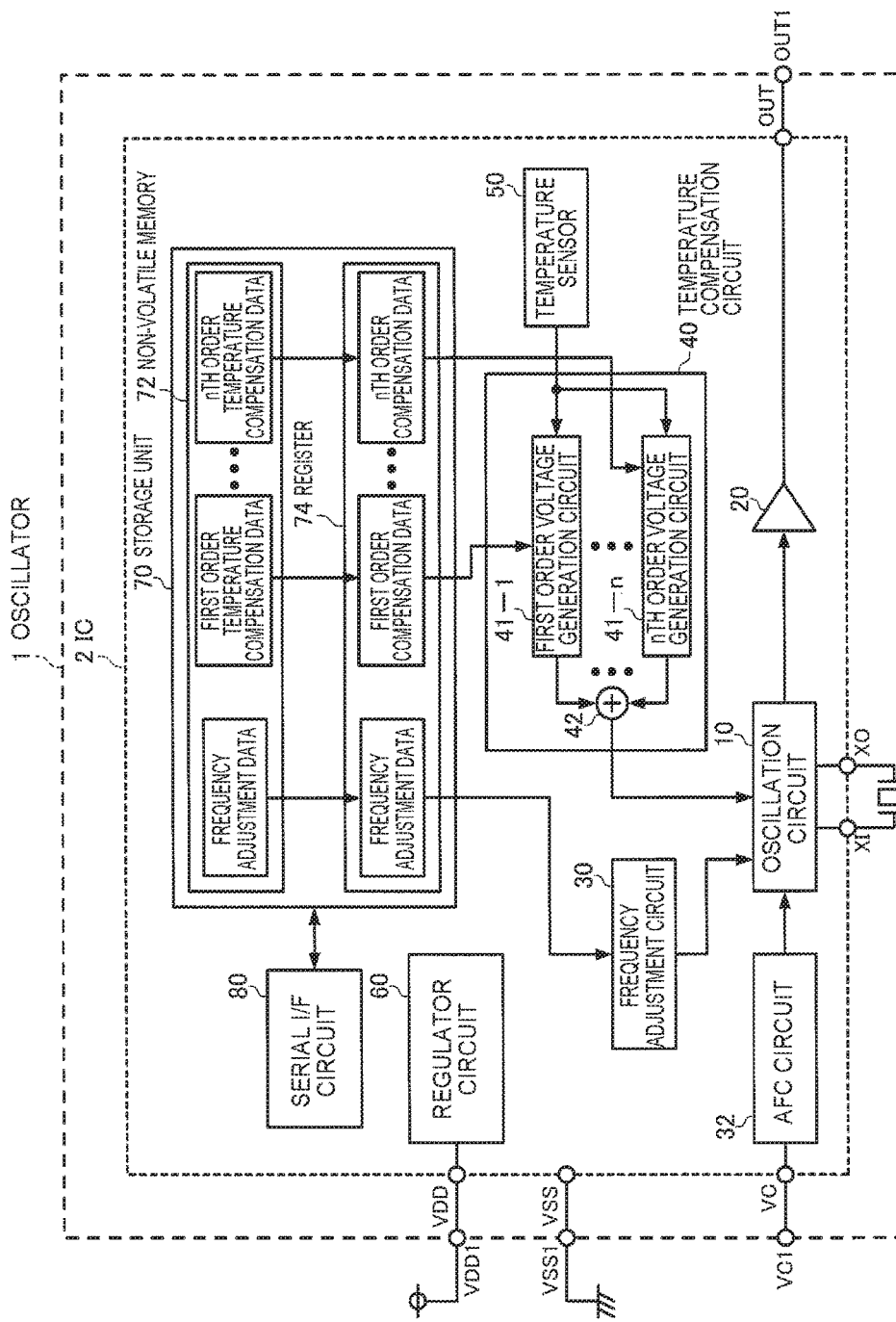
FIG. 3 is a functional block diagram of the oscillator according to the present embodiment.

FIG. 3 is a functional block diagram of the oscillator 1. As illustrated in FIG. 3, the oscillator 1 includes the resonator element 3 and the integrated circuit (IC) 2 for oscillating the resonator element 3, and the integrated circuit (IC) 2 and the resonator element 3 are contained in the package 4.

The integrated circuit (IC) 2 includes a VDD terminal that is a power supply terminal, a VSS terminal that is a ground terminal, an OUT terminal that is an output terminal, a VC terminal to which a signal that controls a frequency is input, an XI terminal and an XO terminal that are connection terminals connected to the resonator element 3. The VDD terminal, the VSS terminal, the OUT terminal, and the VC terminal are exposed on a surface of the integrated circuit (IC) 2, and are respectively connected to external terminals VDD1, VSS1, OUT1, and VC1 which are provided in the package 4. In addition, the XI terminal is connected to one terminal (terminal on a side) of the resonator element 3, and the XO terminal is connected to the other terminal (terminal on the other side) of the resonator element 3.

In the present embodiment, the integrated circuit (IC) 2 is configured to include an oscillation circuit 10, an output circuit 20, a frequency adjustment circuit 30, an automatic frequency control (AFC) circuit 32, a temperature compensation circuit 40, a temperature sensor 50, a regulator circuit 60, a storage unit 70, and a serial interface (I/F) circuit 80. The integrated circuit (IC) 2 may have a configuration in which a part of the elements is omitted or changed, or may have a configuration in which other elements are added.

The regulator circuit 60 generates a part or all of a power supply voltage, or a constant voltage which becomes a reference voltage of the oscillation circuit 10, the frequency adjustment circuit 30, the AFC circuit 32, the temperature compensation circuit 40, and the output circuit 20, based on the power supply voltage VDD (positive voltage) which is supplied from the VDD terminal.

The storage unit 70 includes a non-volatile memory 72 and a register 74, and is configured to be able to perform reading of data from or writing of data to the non-volatile memory 72 or the register 74 from an external terminal through the serial interface circuit 80. In the present embodiment, the terminals of the integrated circuit (IC) 2 which are connected to the external terminals of the oscillator 1 are just four terminals of VDD, VSS, OUT, and VC, and thus, for example, when a voltage at the VDD terminal is higher than a threshold, the serial interface circuit 80 receives a clock signal which is input from the VC terminal and a data signal which is input from the OUT terminal, and performs reading of data from or writing of data to the non-volatile memory 72 or the register 74.

The non-volatile memory 72 is a storage unit for storing various control data, and may be various rewritable non-volatile memories, such as, an electrically erasable programmable read-only memory (EEPROM) or a flash memory, or may be various non-volatile memories which are not rewritable such as a one-time programmable read only memory (PROM).

The non-volatile memory 72 stores frequency adjustment data for controlling the frequency adjustment circuit 30 or temperature compensation data (first order compensation data, . . . , nth order compensation data) for controlling the temperature compensation circuit 40. Furthermore, the non-volatile memory 72 also stores data (not illustrated) for respectively controlling the output circuit 20 and the AFC circuit 32.

The frequency adjustment data is data for adjusting the frequency of the oscillator 1, and if the frequency of the oscillator 1 is shifted from a desired frequency, the frequency adjustment data is rewritten, and thus fine adjustment can be made such that the frequency of the oscillator 1 approximates a desired frequency.

The temperature compensation data (first order compensation data, . . . , nth order compensation data) is calculated during temperature compensation adjustment of the oscillator 1, is data for compensating for frequency temperature characteristics of the oscillator 1, and may be first to nth order coefficient values according to each order component of the frequency temperature characteristics of the resonator element 3. Here, a value which negates frequency temperature characteristics of the resonator element 3, and furthermore, can also compensate for the influence of the temperature characteristics of the integrated circuit (IC) 2 is selected as the maximum order n of the temperature compensation data. For example, n may be an integer value which is greater than a major order of the frequency temperature characteristics of the resonator element 3. For example, if the resonator element 3 is an AT cut quartz crystal resonator element, the frequency temperature characteristics exhibits a third curved line, a major order thereof is 3, and thus, an integer value (for example, 5 or 6) which is greater than 3 may be selected as n. The temperature compensation data may include all of the first to nth order compensation data, and may include only a part of the first to nth order compensation data.

Each piece of the data that is stored in the non-volatile memory 72 is transferred from the non-volatile memory 72 to the register 74, and retained in the register 74, when a power supply is supplied to the integrated circuit (IC) 2 (when the voltage at the VDD terminal increases from zero volts to a desired voltage). Then, frequency adjustment data which is retained in the register 74 is input to the frequency adjustment circuit 30, the temperature compensation data (first order compensation data, . . . , nth order compensation data) which is retained in the register 74 is input to the temperature compensation circuit 40, and data for each control which is retained in the register 74 is also input to the output circuit 20 or the AFC circuit 32.

If it is not possible to rewrite data to the non-volatile memory 72, when the oscillator 1 is inspected, each piece of data is directly written to each bit of the register 74 which retains each piece of data that is transferred from the non-volatile memory 72, from an external terminal through the serial interface circuit 80, and thereby the oscillator 1 is adjusted and selected so as to satisfy desired characteristics, and each piece of data which is adjusted and selected is finally written to the non-volatile memory 72. In addition, if the non-volatile memory 72 is rewritable, when the oscillator 1 is inspected, each piece of data may be written to the non-volatile memory 72 from an external terminal through the serial interface circuit 80. However, since writing to the non-volatile memory 72 takes time in general, each piece of data may be directly written to each bit of the register 74 from an external terminal through the serial interface circuit 80, and each piece of data which is adjusted and selected may be finally written to the non-volatile memory 72, in order to reduce inspection time, when the oscillator 1 is inspected.

The oscillation circuit 10 amplifies an output signal of the resonator element 3 for feeding back to the resonator element 3, and thereby the resonator element 3 oscillates and an oscillation signal is output based on the oscillation of the resonator element 3. For example, a current at an oscillation stage of the oscillation circuit 10 is controlled by the control data that is retained in the register 74.

The frequency adjustment circuit 30 generates a voltage according to the frequency adjustment data that is retained in the register 74, and applies the voltage to one terminal of a variable capacitance element (not illustrated) which functions as a load capacitor of the oscillation circuit 10. As a result, an oscillation frequency (reference frequency) of the oscillation circuit 10 at predetermined temperature (for example, 25° C.) and in a condition in which a voltage at the VC terminal becomes a predetermined voltage (for example, VDD/2) is controlled (finely adjusted) so as to be approximately a desired frequency.

The AFC circuit 32 generates a voltage according to a voltage at the VC terminal, and applies the voltage to one terminal of a variable capacitance element (not illustrated) which functions as a load capacitor of the oscillation circuit 10. As a result, the oscillation frequency (oscillation frequency of the resonator element 3) of the oscillation circuit 10 is controlled based on a voltage value of the VC terminal. For example, a gain of the AFC circuit 32 may be controlled by the control data that is retained in the register 74.

The temperature sensor 50 is a temperature sensing element which outputs a signal (for example, a voltage corresponding to temperature) corresponding to temperature of periphery thereof. The temperature sensor 50 may have positive polarity in which the higher the temperature is, the more an output voltage increases, or may have negative polarity in which the higher the temperature is, the more an output voltage decreases. It is preferable that an output voltage of the temperature sensor 50 changes with respect to a temperature change as linearly as possible, in a desired temperature range in which an operation of the oscillator 1 is guaranteed.

The temperature compensation circuit 40 receives an output signal from the temperature sensor 50, generates a voltage (temperature compensation voltage) for compensating for frequency temperature characteristics of the resonator element 3, and applies the voltage to one terminal of a variable capacitance element (not illustrated) which functions as a load capacitor of the oscillation circuit 10. As a result, the oscillation frequency of the oscillation circuit 10 is controlled so as to be approximately constant regardless of temperature. In the present embodiment, temperature compensation circuit 40 is configured to include a first order voltage generation circuit 41-1 to an nth order voltage generation circuit 41-$n$, and an addition circuit 42.

The first order voltage generation circuit 41-1 to the nth order voltage generation circuit 41-$n$ respectively receive the output signal of the temperature sensor 50, and generate a first order compensation voltage to an nth order compensation voltage which compensate frequency temperature characteristics from first order components to nth order components, according to first order compensation data to nth order compensation data that are retained in the register 74.

The addition circuit 42 adds the first order compensation voltage to the nth order compensation voltage to each other which are respectively generated by the first order voltage generation circuit 41-1 to the nth order voltage generation circuit 41-$n$, and outputs the voltages. An output voltage of the addition circuit 42 becomes an output voltage (temperature compensation voltage) of the temperature compensation circuit 40.

The output circuit 20 receives an oscillation signal which is output from the oscillation circuit 10, generates an oscillation signal for an external output, and outputs the oscillation signal to the outside through the OUT terminal. For example, a frequency division ratio or an output level of the oscillation signal of the output circuit 20 may be controlled by the control data which is retained in the register 74.

The oscillator 1 which is configured as described above functions as a temperature compensated oscillator of a voltage control type (a voltage controlled temperature compensated crystal oscillator (VC-TCXO), if the resonator element 3 is a quartz crystal resonator element) which outputs an oscillation signal of a constant frequency corresponding to a voltage of the external terminal VC1 in a desired temperature range, regardless of temperature.

Method of Manufacturing Oscillator

Figure 4:
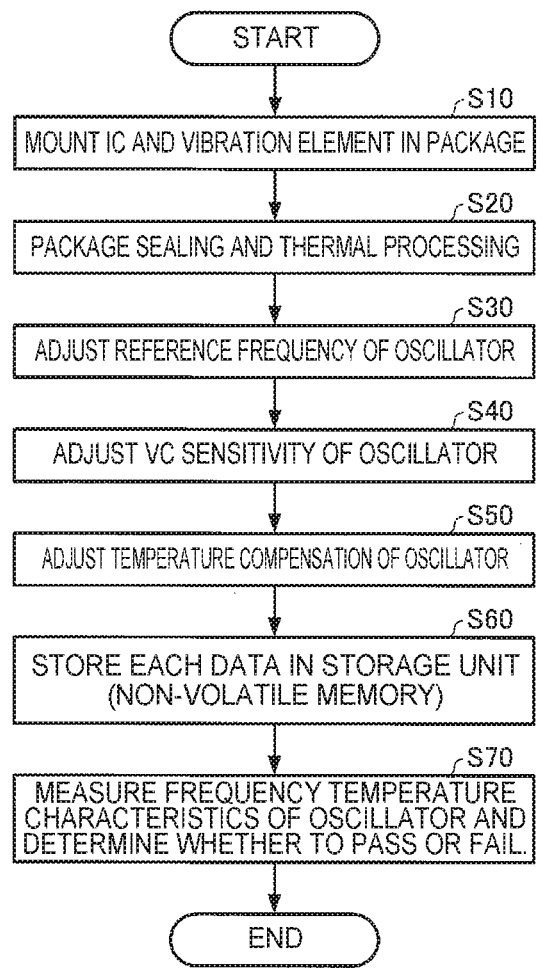
FIG. 4 is a flowchart illustrating an example of the sequence of a method of manufacturing the oscillator according to the present embodiment.

FIG. 4 is a flowchart illustrating an example of the sequence of a method of manufacturing the oscillator 1 according to the present embodiment. A part of step S10 to S70 of FIG. 4 may be omitted or changed, or other steps may be added thereto. In addition, the sequence of each step may be appropriately changed in a possible range.

In an example of FIG. 4, the integrated circuit (IC) 2 and the resonator element 3 (the package 8 which contains the resonator element 3) are first mounted in the package 4 (S10). In step S10, the integrated circuit (IC) 2 is connected to the resonator element 3 by a wire which is provided in the inside of the package 4 or on a surface of the concave portion, and if a power supply is supplied to the integrated circuit (IC) 2, the integrated circuit (IC) 2 is electrically connected to the resonator element 3.

Subsequently, the package 4 is sealed with the lid 5, and the lid 5 adheres to the package 4 by thermal processing (S20). Assembly of the oscillator 1 is completed in step S20.

Subsequently, a reference frequency (frequency at reference temperature T0 (for example, 25° C.)) of the oscillator 1 is adjusted (S30). In step S30, a frequency is measured by oscillating the oscillator 1 at the reference temperature T0, and frequency adjustment data is determined such that frequency deviation approximates zero.

Subsequently, VC sensitivity of the oscillator 1 is adjusted (S40). In step S40, a frequency is measured by oscillating the oscillator 1 in a state in which a predetermined voltage (for example, 0 V or VDD) is applied to the external terminal VC1, and adjustment data of the AFC circuit 32 is determined such that a desired VC sensitivity is obtained.

Subsequently, temperature compensation adjustment of the oscillator 1 is performed (S50). In temperature compensation adjustment step S50, a frequency of the oscillator 1 is measured at multiple temperatures in a desired temperature range (for example, from −40° C. or higher to 85° C. or lower), and temperature compensation data (first order compensation data, . . . , nth order compensation data) for compensating for the frequency temperature characteristics of the oscillator 1 is generated based on the measured results. Specifically, a calculation program of the temperature compensation data approximates the frequency temperature characteristics (including frequency temperature characteristics of the resonator element 3 and temperature characteristics of the integrated circuit (IC) 2) of the oscillator 1 approximates an nth order equation which uses temperature (an output voltage of the temperature sensor 50) as variables), using the measured results of the frequencies at multiple temperatures, and generates temperature compensation data (first order compensation data, . . . , nth order compensation data) according to an approximation equation. For example, the calculation program of the temperature compensation data sets frequency deviation at the reference temperature T0 to zero, and generates the temperature compensation data (first order compensation data, . . . , nth order compensation data) such that a width of the frequency deviation in a desired temperature range decreases.

Subsequently, each piece of data which is obtained in steps S30, S40, and S50 is stored in the non-volatile memory 72 of the storage unit 70 (S60).

Finally, acceptability of the frequency temperature characteristics of the oscillator 1 is determined (S70). In step S70, frequencies of the oscillator 1 are measured while gradually changing the temperature, and it is evaluated whether or not the frequency deviation is within a predetermined range in a desired temperature range (for example, from −40° C. or higher to 85° C. or lower). It is determined that the oscillator is good if frequency deviation thereof is within a predetermined range, and the oscillator fails if frequency deviation thereof is out of the predetermined range.

Frequency Temperature Characteristics of Oscillator

FIGS. 5A to 5F are diagrams illustrating an example of evaluation results of the frequency temperature characteristics of the oscillator 1 according to the present embodiment. FIGS. 5A to 5F are plot diagrams illustrating frequency deviation (deviation from a desired frequency (nominal frequency) of measured frequency), when a temperature gradually changes from −40° C. to +85° C., with respect to six samples different from each other. As illustrated in FIGS. 5A and 5B, frequency deviation is greater than or equal to −150 ppb and smaller than or equal to +150 ppb in a temperature range from 0° C. to +70° C., with respect to six samples. In addition, frequency deviation is also greater than or equal to −150 ppb and smaller than or equal to +150 ppb in a temperature range from −5° C. to +85° C., with respect to six samples. Furthermore, frequency deviation is also greater than or equal to −150 ppb and smaller than or equal to +150 ppb in a temperature range from −40° C. to +85° C., with respect to six samples.

Temperature ranges from 0° C. to +70° C., from −5° C. to +85° C., and from −40° C. to +85° C. are representative temperature ranges which define frequency temperature characteristics of an oscillator existing in the market, and a temperature compensated oscillator with characteristics of frequency deviation which is greater than or equal to −150 ppb and smaller than or equal to +150 ppb in at least a temperature range from −5° C. to +85° C. or from −40° C. to +85° C. does not exist so far. That is, the oscillator 1 according to the present embodiment is an unprecedented novel temperature compensated oscillator, and the oscillator 1 according to the present embodiment can also be used for an electronic apparatus in which, for example, an OCXO is used and which requires high frequency accuracy.

As illustrated in FIG. 2B, in the oscillator 1 according to the present embodiment, the integrated circuit (IC) 2 overlaps the package 8 (resonator element 3) in a planar view which is viewed from an upper surface. In this way, the resonator element 3 and the integrated circuit (IC) 2 are disposed at places which are spatially close to each other, and furthermore, the integrated circuit (IC) 2 is directly attached to the lid 8b of the package 8 which contains the resonator element 3. Accordingly, the heat of the integrated circuit (IC) 2 is conducted to the resonator element 3 in a short time, and thus, a temperature difference between the integrated circuit (IC) 2 and the resonator element 3 decreases compared to the related art. As a result, in the oscillator according to the present embodiment, an error of the temperature compensation performed by the temperature compensation circuit 40 is reduced, and the characteristics can be realized.

It is preferable that a material of the lid 8b is a metal. Since thermal conductivity of the lid 8b is high, the heat of the integrated circuit (IC) 2 is conducted to the resonator element 3 through the lid 8b in a shorter amount of time, and it is possible to further reduce the temperature difference between the integrated circuit (IC) 2 and the resonator element 3, compared to the related art. As a result, an error of the temperature compensation performed by the temperature compensation circuit 40 is further reduced, and characteristics in which frequency deviation is greater than or equal to −150 ppb and smaller than or equal to +150 ppb are easily realized.

In addition, in the temperature compensation adjustment step S50 of FIG. 4, frequency temperature characteristics (including frequency temperature characteristics of the resonator element 3 and temperature characteristics of the integrated circuit (IC) 2) of the oscillator 1 approximates an nth order equation which uses temperature (an output voltage of the temperature sensor 50) as a variable, and temperature compensation data (first order compensation data, . . . , nth order compensation data) according to an approximation equation is generated, and thus, it is necessary to more correctly approximate the frequency temperature characteristics of the oscillator 1 in order to realize the above-described characteristics. Here, since frequency temperature characteristics of the resonator element 3 are dominant in frequency temperature characteristics of the oscillator 1, and thus, it is preferable that frequency temperature characteristics of the resonator element 3 approximate more correctly, in other words, frequency deviation with respect to an approximation equation of the frequency temperature characteristics of the resonator element 3 is smaller.

Figure 6:
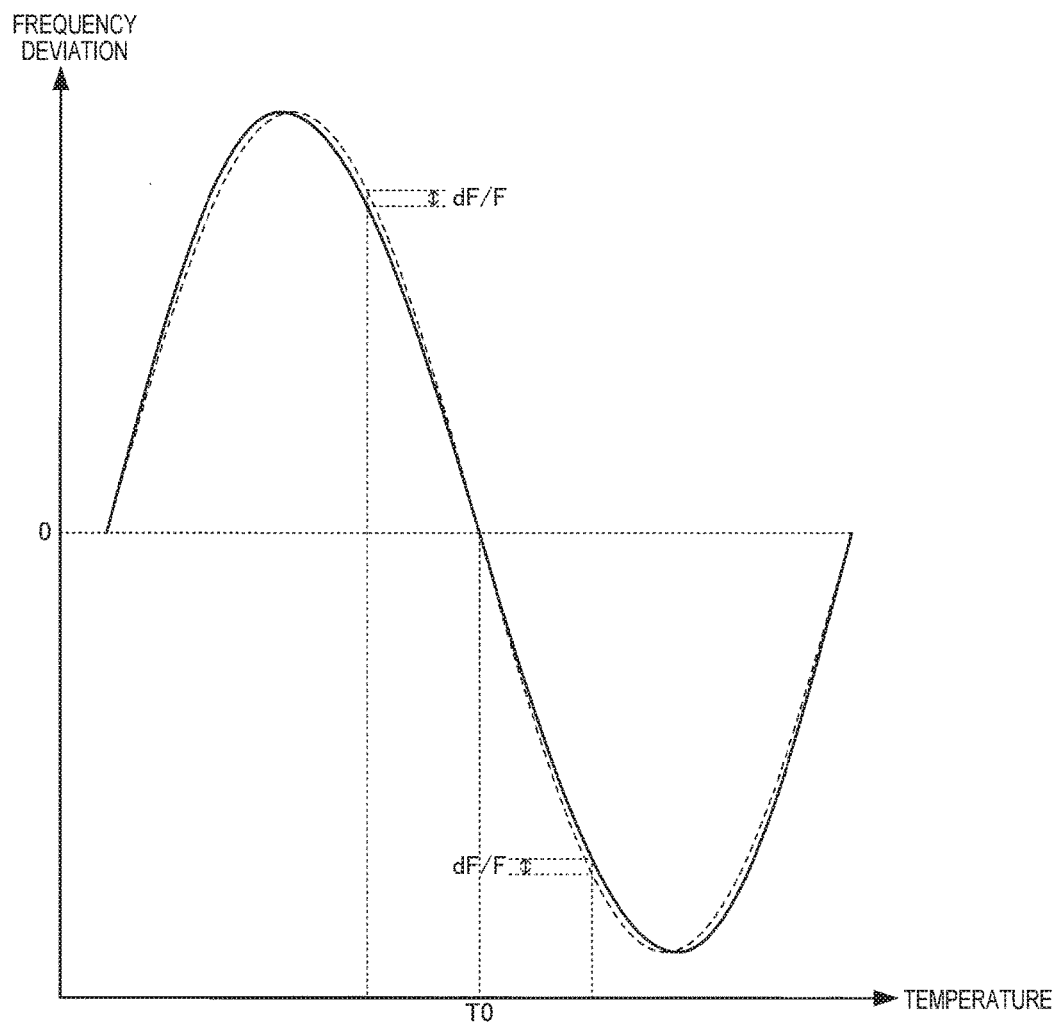
FIG. 6 is an explanatory diagram illustrating frequency deviation of a resonator element.

For example, if the resonator element 3 is an AT cut resonator element, frequency temperature characteristics thereof (solid line of FIG. 6) exhibits a third order curved line (a major order number is 3) as illustrated in FIG. 6, and thus, it is preferable that the frequency deviation dF/F of the resonator element 3 with respect to an approximation equation (dashed line of FIG. 6) which is higher than or equal to a third order of the frequency temperature characteristics of the resonator element 3 is greater than or equal to −150 ppb and smaller than or equal to +150 ppb in a temperature range from 0° C. to +70° C., from −5° C. to +85° C., or from −40° C. to +85° C. According to this, it is possible to easily generate temperature compensation data for realizing the oscillator 1 with frequency deviation which is greater than or equal to −150 ppb and smaller than or equal to +150 ppb in a temperature range from 0° C. to +70° C., from −5° C. to +85° C., or from −40° C. to +85° C., in the temperature compensation adjustment step S50, even if variations of the temperature characteristics of the integrated circuit (IC) 2 are taken into account. As a result, in step S70 of FIG. 4, if it is evaluated whether or not the frequency deviation is within a range from −150 ppb to +150 ppb, a probability that products pass increases, and thus, it is possible to increase a yield.

Since the frequency temperature characteristics of the resonator element 3 change depending upon parameters such as, positions or shapes of the excitation electrodes 3a and 3b, or a shape or size of the resonator element 3, it is possible to realize the resonator element 3 with frequency deviation dF/F which is greater than or equal to −150 ppb and smaller than or equal to +150 ppb in a temperature range from −40° C. to +85° C., by determining parameter values such that a dip in the frequency temperature characteristics does not occur, for example, even at an upper limit or a lower limit of variation of characteristics at the time of mass production, in a design step of the resonator element 3.

Furthermore, in the temperature compensation adjustment step S50, it is efficient that, in order to more reflect the temperature characteristics of the integrated circuit (IC) 2 to temperature compensation data to be generated, the number of temperatures for measuring a frequency increases, or the frequency temperature characteristics of the oscillator 1 approximate to higher order equations. For example, if the resonator element 3 is an AT cut resonator element, it is preferable that a frequency is measured at temperature which is higher than or equal to 10 points in a temperature range from −40° C. to +85° C. and the frequency temperature characteristics of the oscillator 1 approximate to equations which are higher than or equal to a fifth order. If doing so, in the temperature compensation adjustment step, the temperature characteristics of the integrated circuit (IC) 2 are also added, and temperature compensation data for realizing the oscillator 1 with frequency deviation which is greater than or equal to −150 ppb and smaller than or equal to +150 ppb in a temperature range from 0° C. to +70° C., −5° C. to +85° C., or −40° C. to +85° C. is easily generated. As a result, it is possible to further increase a yield.

1-2. Second Embodiment

Figure 7A:
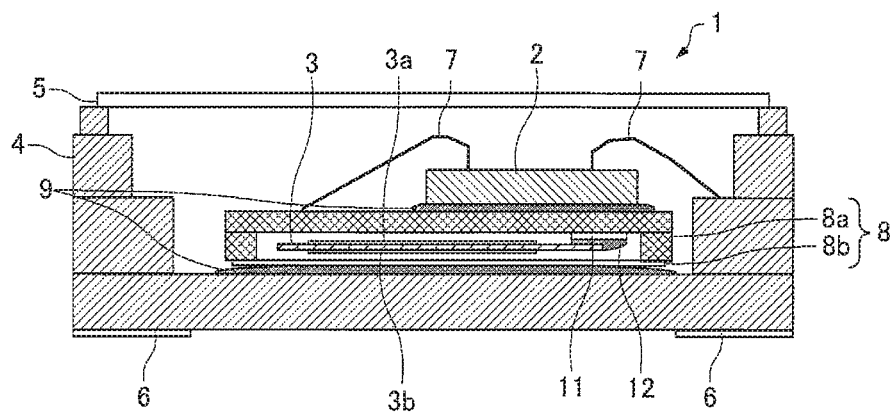
FIG. 7A is a sectional view of an oscillator according to a second embodiment.
Figure 7B:
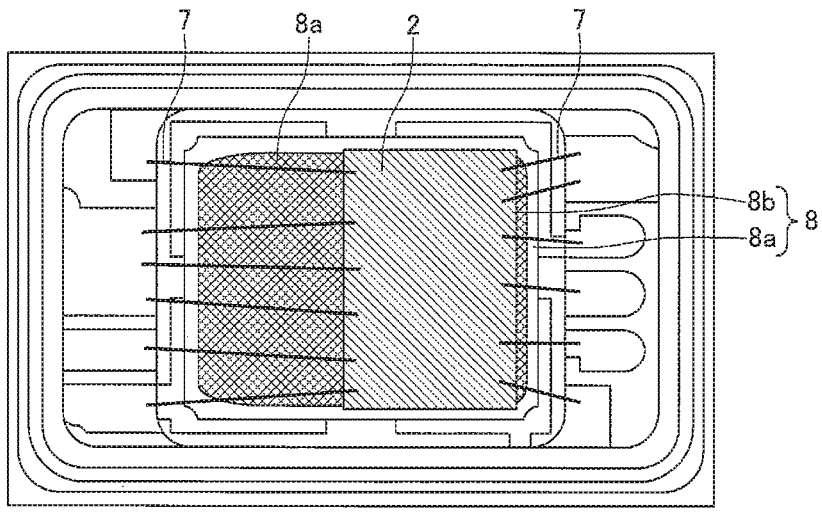
FIG. 7B is a top view of the oscillator according to the second embodiment.

FIGS. 7A and 7B are views illustrating a structure of an oscillator according to a second embodiment. FIG. 7A is a cross-sectional view (cross-sectional diagram taken along line A-A' of FIG. 1) of the oscillator according to the second embodiment, and FIG. 7B is a top view of the oscillator according to the second embodiment. However, FIG. 7B illustrates a state without the lid 5 of FIG. 7A. Since a perspective view and a bottom view are the same as those of the oscillator 1 (FIG. 1 and FIG. 2C) according to the first embodiment, a perspective view and a bottom view of the oscillator 1 according to the second embodiment will not be illustrated or described. In the same manner, since a configuration and a manufacturing method are the same as those of the oscillator 1 (FIG. 3 and FIG. 4) according to the first embodiment, a configuration and a manufacturing method of the oscillator 1 according to the second embodiment will not be illustrated or described.

As illustrated in FIG. 7A, the oscillator 1 according to the second embodiment is configured to include the integrated circuit (IC) 2 that is a semiconductor device, the resonator element 3, the package 4, the lid 5, and the external terminal 6 in the same manner as in the first embodiment.

The package 4 contains the integrated circuit (IC) 2 and the resonator element 3 in the same space. Specifically, a concave section is provided in the package 4, and the package 4 contains the integrated circuit (IC) 2 and the resonator element 3 by covering the concave section using the lid 5. Wires (not illustrated) for electrically connecting two terminals (an XO terminal and an XI terminal of FIG. 3) of the integrated circuit (IC) 2 to two terminals (excitation electrodes 3a and 3b) of the resonator element 3, respectively, are provided in the inside of the package 4 or on a surface of the concave section. In addition, wires (not illustrated) which are electrically connected to each of the external terminals 6 are provided in the inside of the package 4 or on the surface of the concave section, and each wire is bonded to each terminal of the integrated circuit (IC) 2 by bonding wires 7 of gold or the like.

The resonator element 3 includes the excitation electrodes 3a and 3b of a metal on a front surface and a rear surface thereof, respectively, and oscillates at a desired frequency (frequency required by the oscillator 1) corresponding to mass of the resonator element 3 including the excitation electrodes 3a and 3b.

In the present embodiment, the resonator element 3 is contained in the package 8 including the base 8a and the lid 8b (the resonator element 3 is fixed to the electronic pad 11 which is disposed on the base 8a by the connection member 12 such as conductive adhesive), and the lid 8b is bonded to the package 4 by the adhesive member 9 such as a resin. In addition, the integrated circuit (IC) 2 is bonded to the package 8 by the adhesive member 9. Particularly, in the present embodiment, the integrated circuit (IC) 2 is bonded to the base 8a (terminal surface) by the adhesive member 9.

As illustrated in FIG. 7B, also in the present embodiment, the integrated circuit (IC) 2 overlaps the package 8 (the resonator element 3), in a planar view in which the oscillator 1 is viewed from an upper surface thereof, in the same manner as in the first embodiment (FIG. 2B). In this way, the resonator element 3 and the integrated circuit (IC) 2 are disposed at places which are spatially close to each other, and furthermore, the integrated circuit (IC) 2 is directly attached to the base 8a of the package 8 which contains the resonator element 3. As a result, the heat of the integrated circuit (IC) 2 is conducted to the resonator element 3 in a short time, and thus, a temperature difference between the integrated circuit (IC) 2 and the resonator element 3 decreases, compared to the related art. Particularly, since the integrated circuit (IC) 2 overlaps the connection member 12 in a planar view, a thermal transfer path between the integrated circuit (IC) 2 and the resonator element 3 is shortened. Accordingly, it is possible to reduce the temperature difference more effectively. As a result, also in the oscillator 1 according to the present embodiment, an error of the temperature compensation performed by the temperature compensation circuit 40 is reduced in the same manner as in the first embodiment, and characteristics in which frequency deviation is greater than or equal to −150 ppb and smaller than or equal to +150 ppb in a temperature range from 0° C. to +70° C., from −5° C. to +85° C., or from −40° C. to +85° C. can be easily realized.

That is, the oscillator 1 according to the second embodiment also has characteristics in which frequency deviation is greater than or equal to −150 ppb and smaller than or equal to +150 ppb in a temperature range −5° C. to +85° C., or from −40° C. to +85° C., in the same manner as in the first embodiment, and is an unprecedented novel temperature compensated oscillator. In addition, the oscillator 1 according to the present embodiment can also be used for an electronic apparatus in which, for example, an OCXO is used and which requires high frequency accuracy.

Also in the present embodiment, it is preferable that frequency deviation with respect to an approximation equation of the frequency temperature characteristics of the resonator element 3 is small, in the same manner as in the first embodiment. In addition, it is preferable that, for example, if the resonator element 3 is AT cut resonator element, frequency deviation dF/F of the resonator element 3 with respect to an approximation equation higher than or equal to a third order of the frequency temperature characteristics of the resonator element 3 is greater than or equal to −150 ppb and smaller than or equal to +150 ppb in a temperature range from 0° C. to +70° C., from −5° C. to +85° C., or from −40° C. to +85° C. If doing so, in the temperature compensation adjustment step S50, it is possible to easily generate temperature compensation data for realizing the oscillator 1 with frequency deviation of the frequency temperature characteristics which is greater than or equal to −150 ppb and smaller than or equal to +150 ppb in a temperature range from 0° C. to +70° C., from −5° C. to +85° C., or from −40° C. to +85° C., even if variations of temperature characteristics of the integrated circuit (IC) 2 are taken into account. As a result, it is possible to increase a yield.

Furthermore, also in the present embodiment, by increasing the number of temperatures for measuring a frequency or by approximating the frequency temperature characteristics of the oscillator 1 to a higher order equation, in the temperature compensation adjustment step S50, in the same manner as in the first embodiment, the temperature characteristics of the integrated circuit (IC) 2 are also added, and thus, temperature compensation data for realizing the oscillator 1 with frequency deviation of the frequency temperature characteristics which is greater than or equal to −150 ppb and lower than or equal to +150 ppb in a temperature range from 0° C. to +70° C., from −5° C. to +85° C., or from −40° C. to +85° C. is easily generated, and it is possible to increase a yield.

1-3. Modification Example

The oscillator 1 according to each embodiment described above can be modified in various ways.

For example, in the oscillator 1 according to each embodiment described above, the integrated circuit (IC) 2 is mounted on the resonator element 3 (an upper surface of the package 8 containing the resonator element 3), but the oscillator 1 may have a structure in which the resonator element 3 (an upper surface of the package 8 containing the resonator element 3) is mounted on the integrated circuit (IC) 2. Also in the oscillator having the structure, in a planar view in which the oscillator is viewed from an upper surface, the integrated circuit (IC) 2 overlaps the package 8 (the resonator element 3), the resonator element 3 and the integrated circuit (IC) 2 are disposed at places which are spatially close to each other. Furthermore, the integrated circuit (IC) 2 is directly attached to the lid 8*b* or the base 8*a* of the package 8 in which the resonator element 3 is contained, and thus, the heat of the integrated circuit (IC) 2 is conducted to the resonator element 3 in a short time. Hence, since a temperature difference between the integrated circuit (IC) 2 and the resonator element 3 decreases, compared to the related art, an error of the temperature compensation performed by the temperature compensation circuit 40 is reduced, and it is possible to realize characteristics in which frequency deviation is greater than or equal to −150 ppb and smaller than or equal to +150 ppb in a temperature range from 0° C. to +70° C., from −5° C. to +85° C., or from −40° C. to +85° C.

In addition, for example, the oscillator 1 according to each embodiment described above is an oscillator (VC-TCXO or the like) having a temperature compensation function and a voltage control function (frequency control function), but may be a temperature compensated oscillator (TCXO or the like) without a voltage control function (frequency control function).

2. Electronic Apparatus

Figure 8:
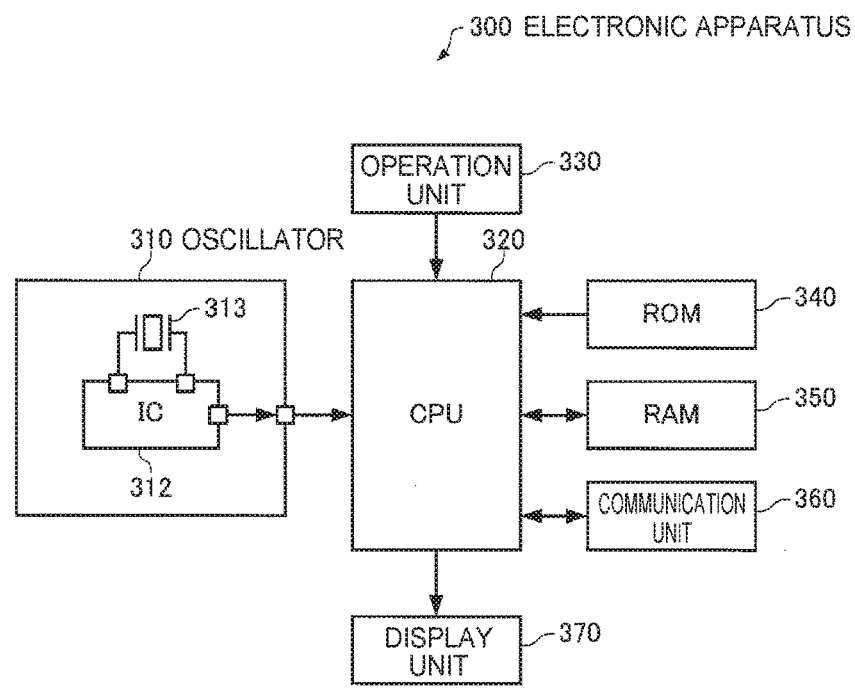
FIG. 8 is a functional block diagram illustrating an example of a configuration of an electronic apparatus according to the present embodiment.
Figure 9:
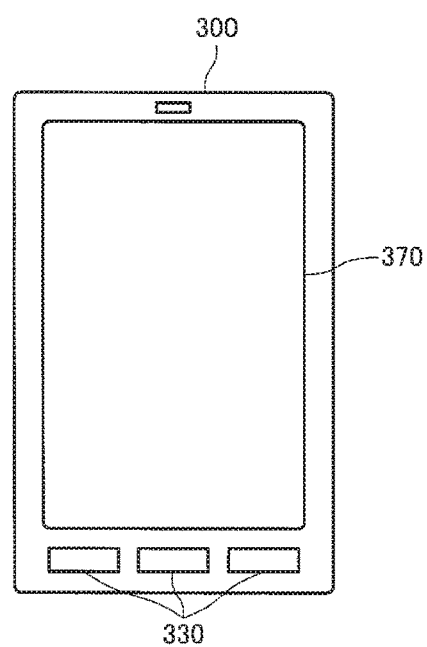
FIG. 9 is a view illustrating an example of an appearance of the electronic apparatus according to the present embodiment.

FIG. 8 is a functional block diagram illustrating an example of a configuration of an electronic apparatus according to the present embodiment. FIG. 9 is a view illustrating an example of an appearance of a smart phone which is an example of the electronic apparatus according to the present embodiment.

An electronic apparatus 300 according to the present embodiment is configured to include an oscillator 310, a central processing unit (CPU) 320, an operation unit 330, a read only memory (ROM) 340, a random access memory (RAM) 350, a communication unit 360, and a display unit 370. The electronic apparatus according to the present embodiment may have a configuration in which a part of the configuration elements (each unit) of FIG. 8 is omitted or changed, or may have a configuration in which other configuration elements are added.

The oscillator 310 includes an integrated circuit (IC) 312 and a resonator element 313. The integrated circuit (IC) 312 generates an oscillation signal by oscillating the resonator element 313. The oscillation signal is output from an external terminal of the oscillator 310 to the CPU 320.

The CPU 320 performs various types of calculation processing or control processing, using the oscillation signal which is input from the oscillator 310 as a clock signal, according to a program that is stored in the read only memory (ROM) 340 or the like. Specifically, the CPU 320 performs various types of processing according to an operation signal from the operation unit 330, processing of controlling the communication unit 360 for performing data communication with an external device, processing of transmitting a display signal for displaying various types of information in the display unit 370, or the like.

The operation unit 330 is an input device which is configured by operation keys, button switches, or the like, and outputs operation signals according to operations performed by a user to the CPU 320.

The ROM 340 stores programs for performing various types of calculation processing or control processing which are controlled by the CPU 320, data, or the like.

The RAM 350 is used as a working area of the CPU 320, and temporarily stores programs or data that are read from the ROM 340, data which is input from the operation unit 330, arithmetic results that are obtained by executing various programs executed by the CPU 320, or the like.

The communication unit 360 performs various controls for performing data communication between the CPU 320 and an external device.

The display unit 370 is a display device which is configured by a liquid crystal display (LCD) or the like, and displays various types of information, based on a display signal which is input from the CPU 320. A touch panel which functions as the operation unit 330 may be provided in the display unit 370.

It is possible to realize an electronic apparatus with high reliability by employing, for example, the above-described oscillator 1 according to each embodiment as the oscillator 310.

Various types of electronic apparatuses may be used as the electronic apparatus 300. For example, a personal computer (for example, a mobile type personal computer, a laptop type personal computer, a tablet type personal computer), a mobile terminal such as a smart phone or a mobile phone, a digital camera, an ink jet type ejection device (for example, an ink-jet printer), a storage area network apparatus such as a router or a switch, a local area network apparatus, an apparatus for a mobile terminal base station, a television, a video camera, a video recorder, a car navigation device, a real-time clock device, a pager, an electronic organizer (also including a communication function), an electronic dictionary, an electronic calculator, an electronic game apparatus, a controller for game, a word processor, a workstation, a video telephone, a television monitor for crime prevention, electronic binoculars, a POS terminal, a medical apparatus (for example, an electronic thermometer, a blood pressure monitor, a blood glucose meter, an electrocardiogram measuring device, an ultrasonic diagnostic apparatus, an electronic endoscope), a fish finder, various measurement apparatuses, instruments (for example, instruments such as, a vehicle, an aircraft, or a ship), a flight simulator, a head-mounted display, a motion tracing device, a motion tracking device, a motion controller, a pedestrian position orientation measurement (PDR), or the like is used.

As an example of the electronic apparatus 300 according to the present embodiment, a transfer device which functions as, for example, a device for terminal station, or the like which performs wireless or wired communication with a terminal, using the above-described oscillator 310 as a reference signal source, a voltage controlled oscillator (VCO), or the like. By employing, for example, the above-described oscillator 1 according to each embodiment as the oscillator 310, it is also possible to realize the electronic apparatus 300 which can be used for, for example, a communication station or the like, and which has high frequency accuracy, high performance, and high reliability, at a lower cost than the related art.

3. Moving Object

Figure 10:
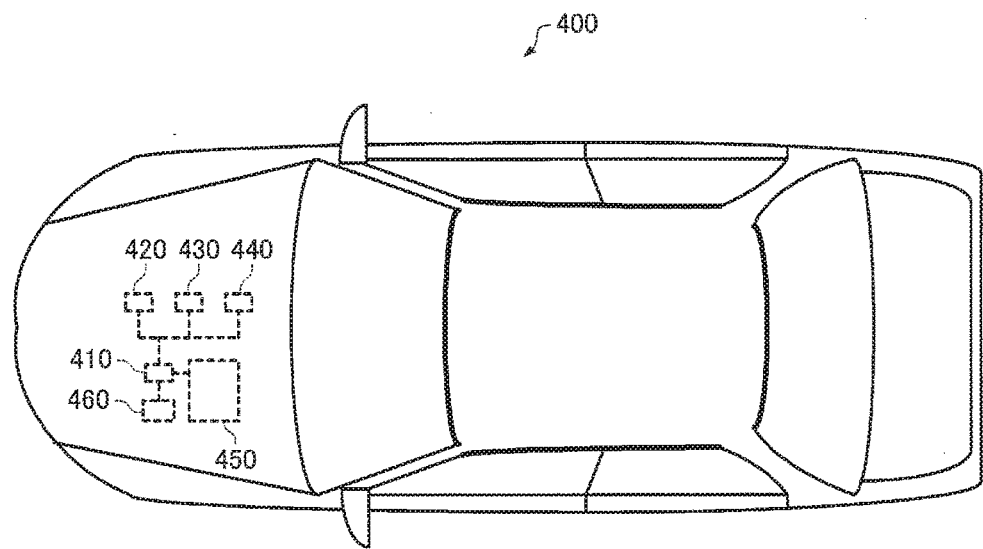
FIG. 10 is a view illustrating an example of a moving object according to the present embodiment.

FIG. 10 is a view (top view) illustrating an example of a moving object according to the present embodiment. A moving object 400 illustrated in FIG. 10 is configured to include an oscillator 410, controllers 420, 430, and 440 which perform various controls of an engine system, a brake system, a keyless entry system, and the like, a battery 450, and a backup battery 460. The moving object according to the present embodiment may have a configuration in which a part of the configuration elements (each unit) of FIG. 10 is omitted, or other configuration elements are added.

The oscillator 410 includes an integrated circuit (IC) and a resonator element which are not illustrated, and the integrated circuit (IC) generates an oscillation signal by oscillating the resonator element. The oscillation signal is output from an external terminal of the oscillator 410 to the controllers 420, 430, and 440, and is used as, for example, a clock signal.

The battery 450 supplies power to the oscillator 410 and the controllers 420, 430, and 440. The backup battery 460 supplies power to the oscillator 410 and the controllers 420, 430, and 440, when an output voltage of the battery 450 is lower than a threshold.

It is possible to realize a moving object with high reliability by employing, for example, the above-described oscillator 1 according to each embodiment as the oscillator 410.

Various moving objects can be used as the moving object 400. For example, a vehicle (including an electric vehicle), an aircraft such as a jet plane or a helicopter, a ship, a rocket, an artificial satellite, or the like can be used as the moving object 400.

The invention is not limited to the present embodiment, and various modifications can be made within a range of the spirit of the invention.

The above-described embodiments and modification examples are examples, and the invention is not limited to the examples. For example, it is possible to appropriately combine each embodiment and each modification example.

The invention includes substantially the same configuration (for example, a function, a configuration having the same method and effects, or a configuration having the same objective and effects) as the configurations described in the embodiments. In addition, the invention includes a configuration in which non-essential portions of the configurations described in the embodiments are replaced. In addition, the invention includes a configuration in which the same actions and effects, or the same objectives as those of the configurations described in the embodiments can be achieved. In addition, the invention includes a configuration in which a known technology is added to the configuration described in the embodiments.

The entire disclosure of Japanese Patent Application No. 2015-067359, filed Mar. 27, 2015 is expressly incorporated by reference herein.

What is claimed is:

1. An oscillator comprising:
a resonator element positioned in a container, the container including a base and a lid that covers the resonator element; and
a semiconductor device including each of an oscillation circuit which outputs an oscillation signal by oscillating the resonator element and a temperature compensation circuit which compensates for temperature characteristics of a frequency of the oscillation signal, the semiconductor device including each of the oscillation circuit and the temperature compensation circuit being bonded to the lid and having a first surface including a terminal that is electrically connected to the resonator element,
wherein the semiconductor device overlaps the resonator element in a planar view, and
wherein frequency deviation of the oscillation signal which is compensated for by the temperature compensation circuit is greater than or equal to −150 ppb and smaller than or equal to +150 ppb in a temperature range from −5° C. to +85° C.

2. The oscillator according to claim 1, wherein the frequency deviation is greater than or equal to −150 ppb and smaller than or equal to +150 ppb in a temperature range from −40° C. to +85° C.

3. The oscillator according to claim 1, wherein deviation of a resonance frequency of the resonator element with respect to an approximation equation which is higher than or equal to a third order of frequency temperature characteristics of the resonator element is greater than or equal to −150 ppb and smaller than or equal to +150 ppb.

4. The oscillator according to claim 1,
wherein the semiconductor device includes a surface, which is bonded to the first container through an adhesive member, on a side opposite to the first surface.

5. The oscillator according to claim 2,
wherein the semiconductor device includes a surface, which is bonded to the first container through an adhesive member, on a side opposite to the first surface.

6. The oscillator according to claim 3,
wherein the semiconductor device includes a surface, which is bonded to the first container through an adhesive member, on a side opposite to the first surface.

7. The oscillator according to claim 4,
wherein the lid is formed of a metal.

8. The oscillator according to claim 5,
wherein the lid is formed of a metal.

9. The oscillator according to claim 6,
wherein the lid is formed of a metal.

10. An oscillator comprising:
a resonator element positioned in a first container, the first container having a first lid formed of a metal that overlaps the resonator element in a planar view;

a semiconductor device including each of an oscillation circuit which outputs an oscillation signal by oscillating the resonator element and a temperature compensation circuit which compensates for temperature characteristics of a frequency of the oscillation signal, the semiconductor device including each of the oscillation circuit and the temperature compensation circuit being bonded to the first lid by an adhesive member and having a first surface that includes a terminal that is electrically connected to the resonator element; and a second container which contains each of the first container and the semiconductor device, wherein frequency deviation of the oscillation signal which is compensated for by the temperature compensation circuit is greater than or equal to −150 ppb and smaller than or equal to +150 ppb in a temperature range from −5° C. to +85° C.

11. The oscillator according to claim 10, wherein the frequency deviation is greater than or equal to −150 ppb and smaller than or equal to +150 ppb in a temperature range from −40° C. to +85° C.

12. The oscillator according to claim 10, wherein deviation of a resonance frequency of the resonator element with respect to an approximation equation which is higher than or equal to a third order of frequency temperature characteristics of the resonator element is greater than or equal to −150 ppb and smaller than or equal to +150 ppb.

13. The oscillator according to claim 10,
wherein the second container includes a second lid which overlaps the first container and the semiconductor device in a planar view,
wherein the second container has an inner surface that includes a surface on which wires are disposed, and a surface on which the second lid is exposed, and
wherein the first container is disposed on the surface on which the wires are disposed.

14. The oscillator according to claim 11,
wherein the second container includes a second lid which overlaps the first container and the semiconductor device in a planar view,
wherein the second container has an inner surface that includes a surface on which wires are disposed, and a surface on which the second lid is exposed, and
wherein the first container is disposed on the surface on which the wires are disposed.

15. An electronic apparatus, comprising:
the oscillator according to claim 1.
16. An electronic apparatus, comprising:
the oscillator according to claim 10.
17. An electronic apparatus, comprising:
the oscillator according to claim 13.
18. A moving object, comprising:
the oscillator according to claim 1.
19. A moving object, comprising:
the oscillator according to claim 10.
20. A moving object, comprising:
the oscillator according to claim 13.
21. An oscillator, comprising:
a first container including a base and a lid;
a resonator element positioned in the first container;
a semiconductor device positioned in the first container, the semiconductor device including an integrated circuit that includes each of an oscillation circuit and a temperature compensation circuit; and
a second container positioned in the first container, the second container including a second base and a second lid, and the second base being sealed with the first container,
wherein the resonator element is sealed within the second container, and
the semiconductor device is adhered to the second lid and sealed by the lid of the first container.

22. An oscillator, comprising:
a first container including a base and a lid;
a resonator element positioned in the first container;
a semiconductor device positioned in the first container, the semiconductor device including an integrated circuit that includes each of an oscillation circuit and a temperature compensation circuit; and
a second container positioned in the first container, the second container including a second base and a second lid, and the second lid being sealed with the first container,
wherein the resonator element is sealed within the second container, and
the semiconductor device is adhered to the second lid and sealed by the base of the first container.

* * * * *